United States Patent
Raj et al.

(10) Patent No.: US 10,177,014 B2
(45) Date of Patent: Jan. 8, 2019

(54) THERMAL RADIATION BARRIER FOR SUBSTRATE PROCESSING CHAMBER COMPONENTS

(71) Applicant: Applied Materials, Inc., Santa Clara, CA (US)

(72) Inventors: Govinda Raj, Bangalore (IN); Daniel Martin, Cupertino, CA (US); Robert T. Hirahara, San Jose, CA (US); Ashish Bhatnagar, Fremont, CA (US); Bopanna Vasanth, Bangalore (IN); Prashanth Rao, Bangalore (IN); Kadthala R. Narendrnath, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 603 days.

(21) Appl. No.: 14/050,196

(22) Filed: Oct. 9, 2013

(65) Prior Publication Data

US 2014/0165915 A1    Jun. 19, 2014

Related U.S. Application Data

(60) Provisional application No. 61/737,477, filed on Dec. 14, 2012.

(51) Int. Cl.
*H01L 21/67* (2006.01)
*H01L 21/687* (2006.01)
(Continued)

(52) U.S. Cl.
CPC .. *H01L 21/67103* (2013.01); *H01L 21/68792* (2013.01)

(58) Field of Classification Search
USPC ............. 118/725; 156/345.52; 219/544, 553
See application file for complete search history.

(56) References Cited

U.S. PATENT DOCUMENTS

| 4,580,522 A | * | 4/1986 | Fujioka | C30B 23/063 118/500 |
| 6,035,101 A | * | 3/2000 | Sajoto | C23C 16/4586 118/728 |

(Continued)

FOREIGN PATENT DOCUMENTS

| CN | 1529994 A | 9/2004 |
| CN | 1643322 A | 7/2005 |

(Continued)

OTHER PUBLICATIONS

PCT Notification of Transmittal of the International Search Report and the Written Opinion of the International Searching Authority for International Application No. PCT/US2013/069974 dated Feb. 20, 2014; 12 total pages.

(Continued)

*Primary Examiner* — Rakesh K Dhingra
(74) *Attorney, Agent, or Firm* — Patterson + Sheridan, LLP

(57) ABSTRACT

An apparatus for a substrate support heater and associated chamber components having reduced energy losses are provided. In one embodiment, a substrate support heater is provided. The substrate support heater includes a heater body having a first surface to receive a substrate and a second surface opposing the first surface, a heating element disposed in the heater body between the first surface and the second surface, and a thermal barrier disposed on the second surface of the heater body, wherein the thermal barrier comprises a first layer and a second layer disposed on the first layer.

18 Claims, 5 Drawing Sheets

(51) Int. Cl.
    *C23C 16/00* (2006.01)
    *C23F 1/00* (2006.01)
    *H01L 21/306* (2006.01)

(56) References Cited

U.S. PATENT DOCUMENTS

| | | | |
|---|---|---|---|
| 6,094,334 A * | 7/2000 | Bedi | H01L 21/6833 361/115 |
| 6,331,697 B2 * | 12/2001 | Savas | 118/50.1 |
| 6,780,787 B2 | 8/2004 | O'Donnell | |
| 6,847,014 B1 | 1/2005 | Benjamin et al. | |
| 2001/0003334 A1 * | 6/2001 | Kano | H01L 21/67103 219/444.1 |
| 2002/0125239 A1 * | 9/2002 | Chen | H01L 21/67103 219/444.1 |
| 2003/0051665 A1 * | 3/2003 | Zhao | C23C 16/45565 118/723 E |
| 2006/0130763 A1 * | 6/2006 | Emerson | C23C 16/46 118/725 |
| 2006/0199131 A1 * | 9/2006 | Kawasaki | C23C 16/4581 432/120 |
| 2007/0102286 A1 * | 5/2007 | Scheible | C23C 14/3407 204/298.01 |
| 2007/0166477 A1 | 7/2007 | Chang | |
| 2007/0243317 A1 * | 10/2007 | Du Bois | C23C 16/4583 427/98.9 |
| 2008/0266745 A1 | 10/2008 | Nobori et al. | |
| 2009/0159587 A1 * | 6/2009 | Shimanuki | H05B 3/143 219/443.1 |
| 2010/0317197 A1 * | 12/2010 | Lind | C23C 16/4401 438/758 |
| 2011/0265722 A1 * | 11/2011 | Takenaka | C23C 16/4584 118/725 |
| 2012/0034471 A1 * | 2/2012 | Peterson | C23C 4/02 428/457 |
| 2012/0115254 A1 | 5/2012 | Singh | |
| 2012/0285621 A1 | 11/2012 | Tan | |
| 2012/0306081 A1 | 12/2012 | Ishizaki et al. | |

FOREIGN PATENT DOCUMENTS

| | | |
|---|---|---|
| CN | 102842524 A | 12/2012 |
| JP | H0722501 A | 1/1995 |
| JP | H08045651 A | 2/1996 |
| JP | H11-343571 A | 12/1999 |
| JP | 2000164567 A | 6/2000 |
| JP | 2001203257 A | 7/2001 |
| JP | 2002343693 A | 11/2002 |
| JP | 2006331752 A | 12/2006 |
| JP | 2009004472 A | 1/2009 |

OTHER PUBLICATIONS

Chinese Office Action for Application No. 201380065251.1 dated Dec. 27, 2016.
Taiwan Office Action for Application No. 102144422 dated Mar. 29, 2017.
Chinese Office Action for Application No. 201380065251.1 dated Sep. 5, 2017.
Japanese Office Action for Application No. 2015-547951 dated Jul. 18, 2017.

* cited by examiner

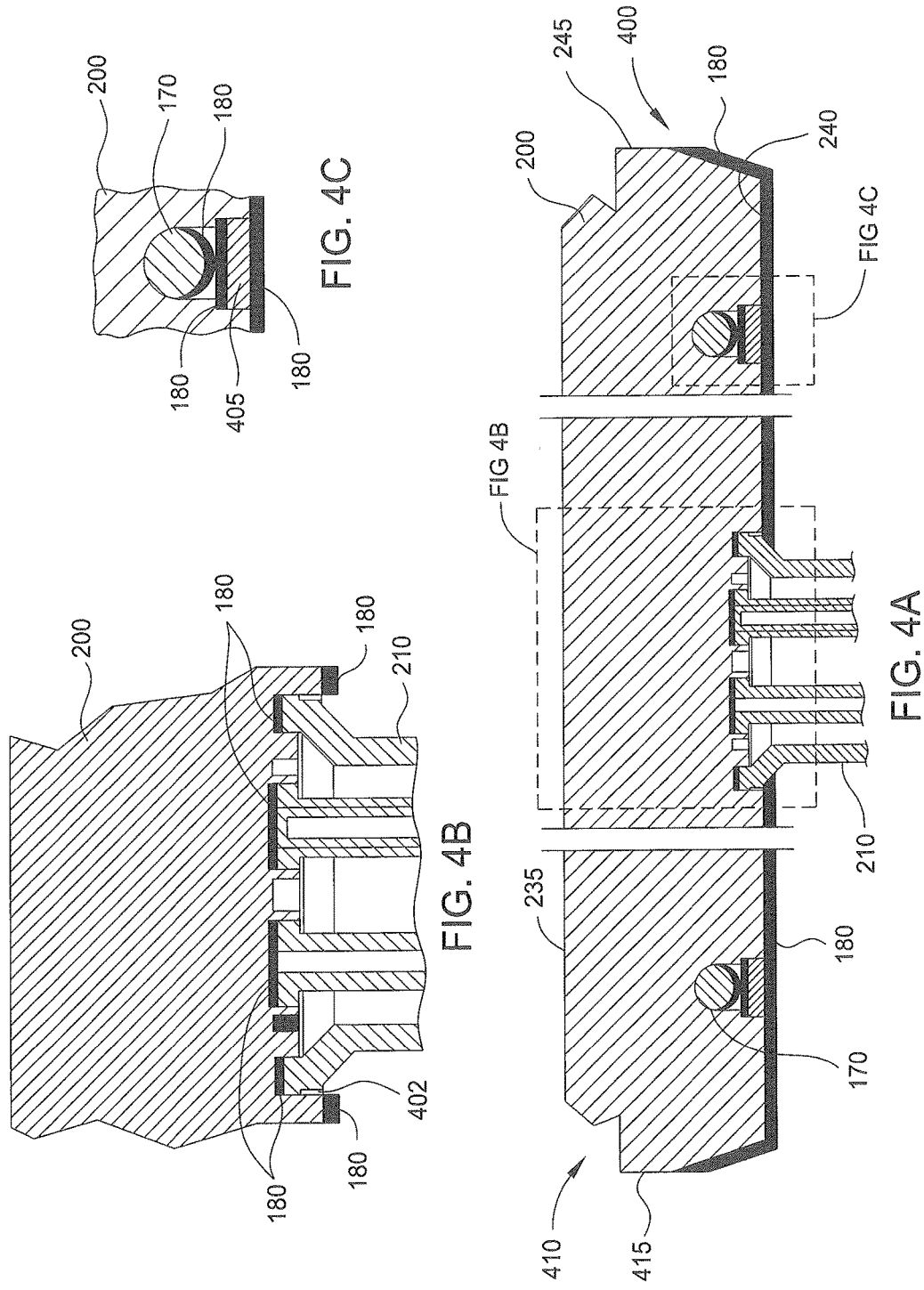

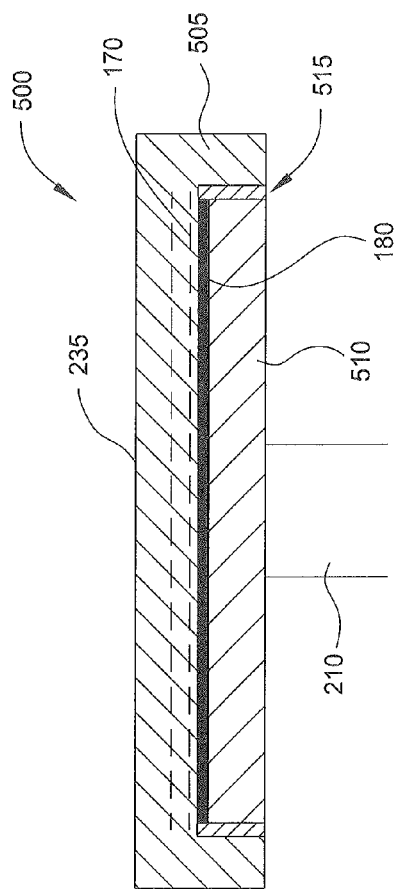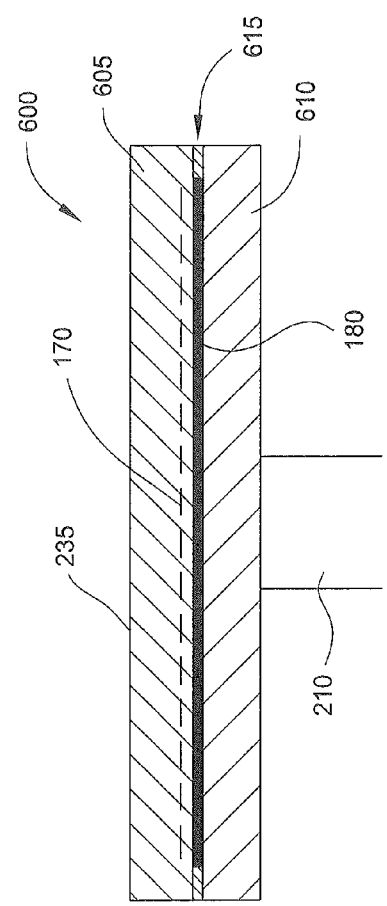

THERMAL RADIATION BARRIER FOR SUBSTRATE PROCESSING CHAMBER COMPONENTS

CROSS-REFERENCE TO RELATED APPLICATIONS

This application claims benefit of U.S. Provisional Patent Application Ser. No. 61/737,477, filed Dec. 14, 2012, which is hereby incorporated by reference herein.

BACKGROUND OF THE INVENTION

Field of the Invention

Embodiments of the invention relate to a thermal barrier for use in chambers and chamber components utilized in thermal processes in the manufacture of electronic devices on substrates.

Description of the Related Art

Substrate processing chambers are commonly used in semiconductor manufacturing in order to fabricate electronic devices on a substrate. These chambers include a heater, which is typically in the form of a disk-shaped body, made of ceramic material, and includes a heating element embedded in the disk-shaped body. The heater is used to support the substrate and the heating element is used to heat the substrate to a desired temperature to facilitate an electronic device fabrication process on the substrate, which includes deposition, implantation, or etching. The heaters, and heating elements embedded therein, are typically constructed to apply uniform thermal energy to a substrate receiving surface of the ceramic body, which is typically an upper surface of the disk-shaped body.

Large amounts of energy are applied to the heating element of the heater, and the heat applied to the heating element is generally transferred by radiation, conduction and/or convection to the substrate. However, a great portion of the energy applied to the heating element is lost through a backside of the disk-shaped body (opposite the substrate receiving surface) as well as minor surfaces (sides) of the disk-shaped body. This lost energy is generally radiated from these surfaces to the chamber where the heater is installed. The lost energy from these surfaces may detract from the efficiency of the process by freeing thermal energy that would otherwise be used to heat the substrate. The lost energy may also be absorbed by other chamber components, and some of the chamber components are required to be maintained at a much lower temperature than the temperature of the heater and/or the temperature of the substrate in order to prevent deposition on these chamber components. As a result, the chamber components must be cooled by cooling fluids to remove the thermal energy radiated by the heater. Thus, the conventional heaters provide inefficient use of power that is converted to thermal energy, and heating of peripheral chamber components requires supplemental cooling apparatus and methods to remove this excess heat, both of which contribute to cost of ownership. Further, surfaces of chamber components that are heated by processes performed therein, such as chamber sidewalls, may lose this thermal energy to the surrounding environment. This lost energy further reduces the efficiency of the manufacturing process and may add to cost of ownership.

Therefore, there is a need for a thermal radiation barrier that is applied to chamber components to reduce thermal energy losses.

SUMMARY OF THE INVENTION

Methods and apparatus for reducing thermal losses of a substrate support heater and associated chamber components are provided. In one embodiment, the substrate support heater may include a disk-shaped body, and a coating, a film, a foil, or a sheet is coupled to at least one major surface of the disk-shaped body as a radiation barrier. The radiation barrier may also be coupled to minor surfaces (sides) of the disk-shaped body in the form of a coating, film, foil or sheet. The radiation barrier may be utilized to reflect thermal energy and/or minimize heat transfer outside of the disk-shaped body. The radiation barrier improves thermal uniformity of at least one major surface of the disk-shaped body by a factor of at least 2. The coating, film, foil or sheet may include yttrium (Y) containing materials, such as yttrium stabilized zirconium oxide ($ZrO_2$). The coating, film, foil or sheet may include oxide mineral species such as Perovskite. The coating, film, foil or sheet may be a monolayer or multiple layers adhered to the surfaces of the disk-shaped body by sintering, plasma spray, electron beam deposition, physical vapor deposition, and combinations thereof. The coating, film, foil or sheet may include nanomaterials as well as nano-sized elemental materials and compounds. The coating, film or sheet may include multiple layers having different properties, such as thickness, density, emissivity, and combinations thereof.

In one embodiment, a substrate support heater is provided. The substrate support heater includes a heater body having a first surface to receive a substrate and a second surface opposing the first surface, a heating element disposed in the heater body between the first surface and the second surface, a stem coupled to the second surface of the heater body, and a thermal barrier disposed on the second surface of the heater body, wherein the thermal barrier comprises a coating, a sheet, or a foil.

In another embodiment, a deposition chamber is provided. The deposition chamber includes an interior volume defined by one or more sidewalls of the chamber, and a substrate support heater disposed in the interior volume. The substrate support heater comprises a heater body having a first surface to receive a substrate and a second surface opposing the first surface, a heating element disposed in the heater body between the first surface and the second surface, a stem coupled to the second surface of the heater body, and a thermal barrier disposed on the second surface of the heater body, wherein the thermal barrier comprises a coating, a sheet, or a foil.

BRIEF DESCRIPTION OF THE DRAWINGS

So that the manner in which the above-recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 4A is a side cross-sectional view of another embodiment of a substrate support heater.

FIG. 4B is an enlarged cross-sectional view of a portion of the substrate support heater of FIG. 4A.

FIG. 4C is an enlarged cross-sectional view of a portion of the substrate support heater of FIG. 4A.

FIG. 5 is a simplified cross-sectional view of another embodiment of a substrate support heater that may be used in the deposition system of FIG. 1.

FIG. 6 is a simplified cross-sectional view of another embodiment of a substrate support heater that may be used in the deposition system of FIG. 1.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Methods and apparatus for a substrate support heater and associated chamber components having reduced energy losses are provided. Embodiments of the present invention provide systems, methods and apparatus using the substrate support heater for depositing films on a substrate and related cleaning processes in a corrosive plasma environment at temperatures greater than about 400 degrees C.

Figure 1:
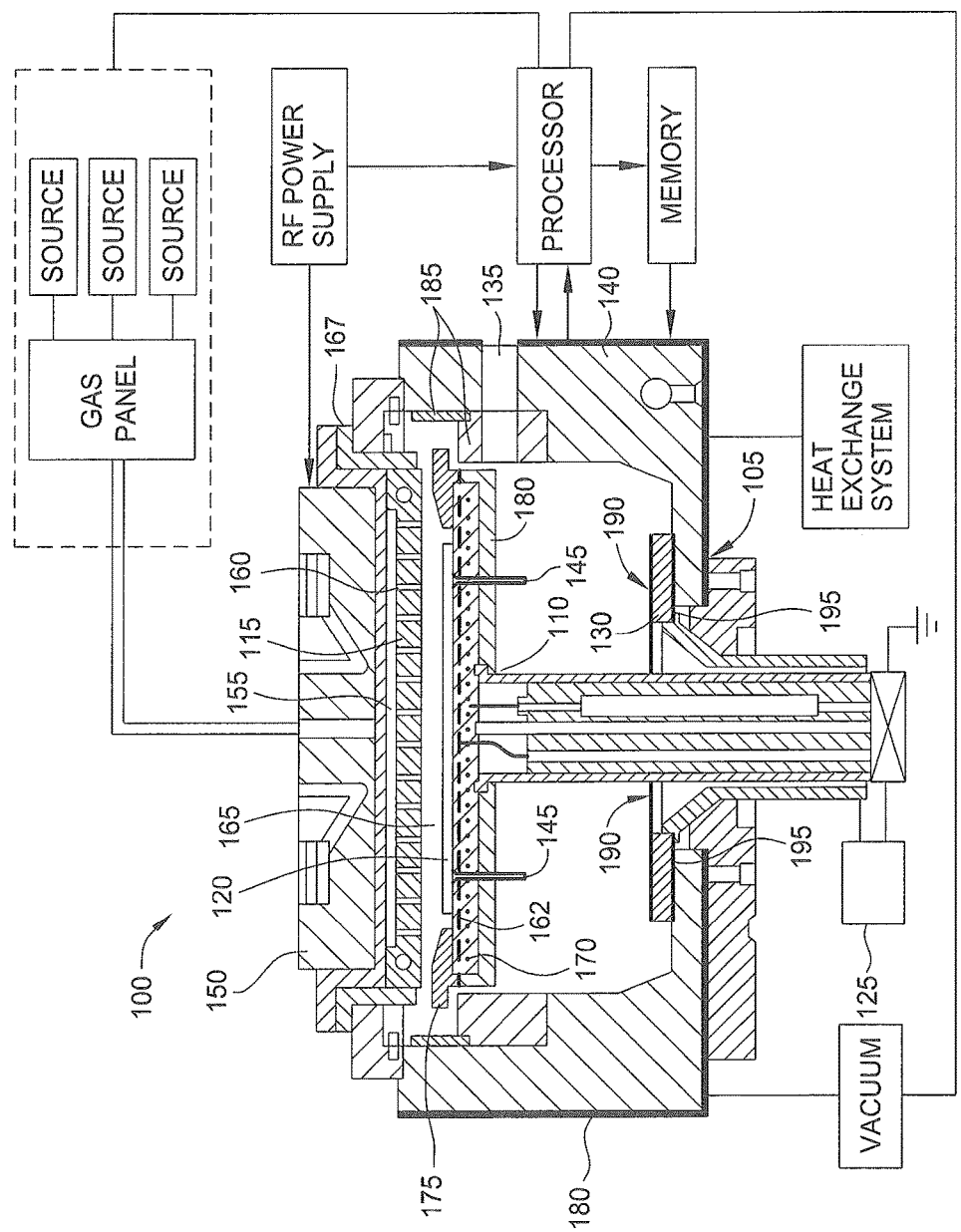
FIG. 1 is a schematic cross-sectional view of a deposition system.

FIG. 1 is a schematic cross-sectional view of a deposition system 100. The deposition system 100 may be configured to deposit materials in the form of thin films on a substrate by dissociation of precursor fluids in a chemical vapor deposition (CVD) process, a plasma enhanced CVD (PECVD) process, or an atomic layer deposition (ALD) process. The deposition system 100 includes a reactor chamber 105, a substrate support heater 110 and a gas distribution showerhead 115 disposed in the interior volume of the reactor chamber 105. A radio frequency (RF) power supply provides radio-frequency power to the reactor chamber 105 for plasma-enhanced processes. A vacuum system is used to maintain a specified pressure in the interior volume of the reactor chamber 105 and also removes gaseous byproducts and spent gases from the interior volume of the reactor chamber 105.

The substrate support heater 110 is shown in a processing position where it supports a substrate 120 in an opposing relationship to the gas distribution showerhead 115. The substrate support heater 110 is coupled to a lift system 125 that moves the substrate support heater 110 toward and away from the gas distribution showerhead 115. A lift plate 130 may also be coupled to the lift system 125. The lift system 125 may operate to lower the substrate support heater 110 to a position adjacent a substrate transfer port 135 formed in a body 140 of the reactor chamber 105. The lift system 125 may also raise the lift plate 130 to actuate lift pins 145 to space the substrate 120 apart from the substrate support heater 110 where a robot blade (not shown) may transfer the substrate 120 through the substrate transfer port 135.

In operation, precursor gases are provided from one or more gas sources to a lid plate 150 disposed on the body 140 of the reactor chamber 105. The precursor gases are flowed to an interstitial volume 155 formed between a lower surface of the lid plate 150 and the upper surface of the gas distribution showerhead 115. The precursor gases are then flowed though openings 160 formed in the gas distribution showerhead 115. The RF power supply is used to bias the gas distribution showerhead 115 relative to an electrode 162 in the substrate support heater 110 to produce a plasma of the precursor gases in a processing volume 165 between the substrate 120 and the lower surface of the gas distribution showerhead 115. The lid plate 150 and the gas distribution showerhead 115 may be insulated from the body 140 of the reactor chamber 105 by insulation members 167. The precursor gases are dissociated in the processing volume 165 and species are deposited on the upper surface of the substrate 120 to form electronic devices thereon.

During the deposition process, the substrate 120 is heated to a desired temperature by an embedded heating element 170. The temperature of the substrate 120 may be maintained to a temperature of about 200 degrees C. to about 700 degrees C. or greater, to facilitate deposition on the substrate 120. Other portions of the substrate support heater 110 where deposition is not desired are shielded by a deposition ring 175. Additionally, other components of the reactor chamber 105 in proximity to the substrate support heater 110, as well as the processing volume 165, are maintained at low temperatures (e.g., less than about 100 degrees C.) to prevent deposition thereon.

To assist in isolating the heat from the heating element 170 in the substrate support heater 110, a thermal barrier 180 is disposed on a surface of the substrate support heater 110. For example, the thermal barrier 180 may be disposed on a lower surface of the substrate support heater 110. The thermal barrier 180 may also be extended along a portion of a minor side (i.e., an edge) of the substrate support heater 110. The thermal barrier 180 provides more efficient use of the power applied to the heating element 170 by trapping thermal energy in the body of the substrate support heater 110. The thermal barrier 180 provides a radiation barrier to channel thermal energy from the heating element 170 toward the substrate 120 and the substrate receiving surface of the substrate support heater 110. The thermal barrier 180 thus enhances temperature control and/or uniformity across the substrate 120 while utilizing less energy to operate the heating element 170. The thermal barrier 180 may also be utilized to prevent heat from radiating out of the body of the substrate support heater 110, thereby minimizing heating of the interior surfaces of chamber components and structures, such as the body 140 of the reactor chamber 105.

While the thermal barrier 180 minimizes radiation from the substrate support heater 110 to reduce heating of the chamber components and structures, the temperature of the body 140 of the reactor chamber 105 may be at a temperature that may promote deposition thereon. Thus, liners 185 may be disposed between the body 140 and the substrate support heater 110 to prevent deposition on the interior surfaces of the reactor chamber 105. A heat exchange system may also be coupled to the reactor chamber 105 to flow cooling fluids to the body 140 of the reactor chamber 105, thereby dissipating heat from the reactor chamber 105 and maintaining certain portions of the reactor chamber 105 at a suitable temperature for stable processing. The thermal barrier 180 may also be disposed on outer surfaces of the body 140 of the reactor chamber 105 to thermally insulate the reactor chamber 105. The lift plate 130 may also include thermally reflective surface 190, such as a polished surface to reflect heat toward the thermal barrier 180 on the substrate support heater 110. The lift plate 130 may also include a coating 195 on a lower surface thereof to facilitate reflection of thermal energy toward the substrate support heater 110. Examples of the coating 195 may include boron nitride or hard anodized aluminum.

Figure 2:
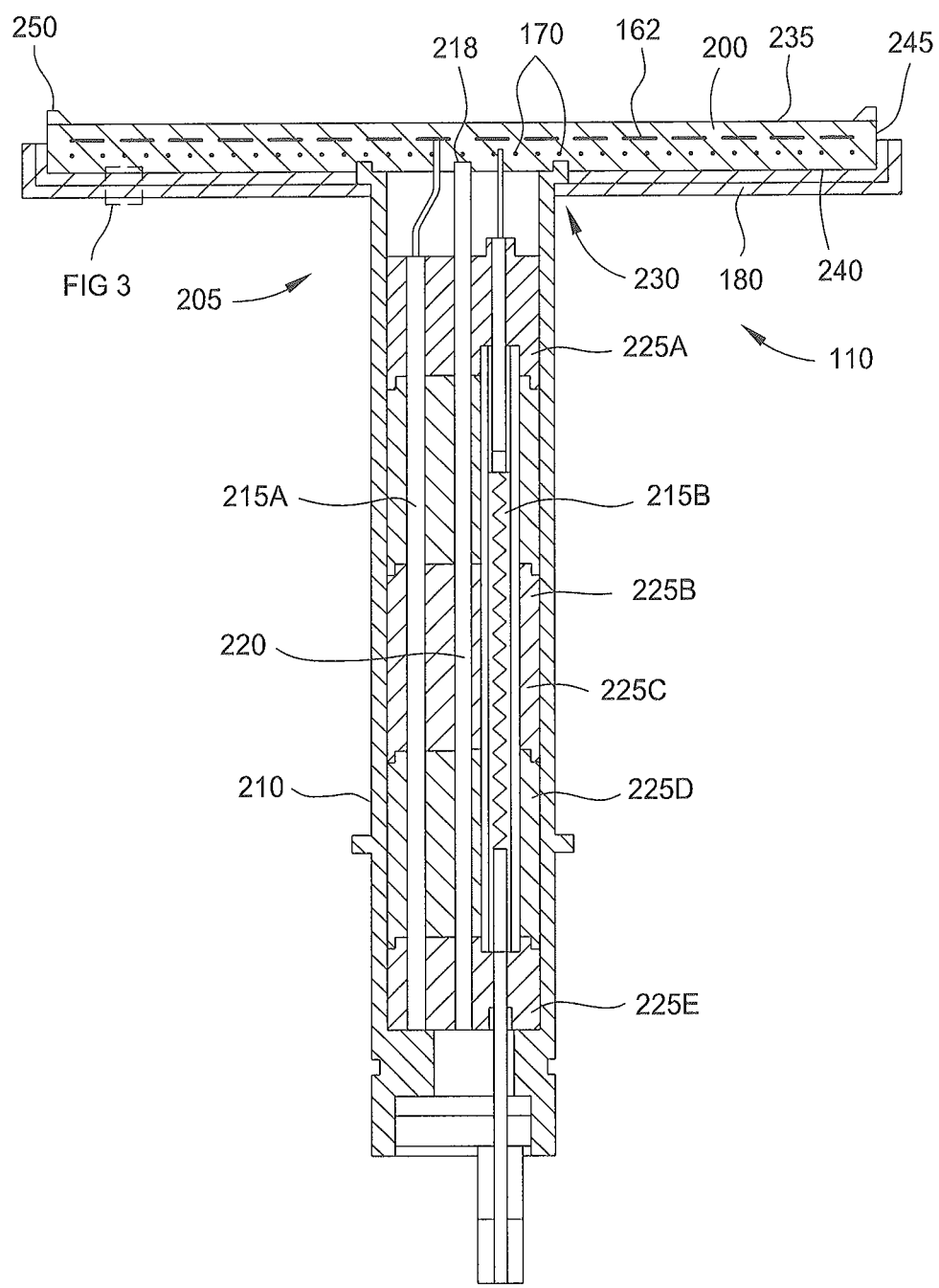
FIG. 2 is a simplified cross-sectional view of the substrate support heater of FIG. 1.

FIG. 2 is a simplified cross-sectional view of the substrate support heater 110 of FIG. 1. The substrate support heater 110 includes a heater body 200 disposed on a pedestal assembly 205. The heater body 200 includes the heating element 170 and the electrode 162, which is coupled to the RF power supply and may function as a ground plane. The pedestal assembly 205 includes a shaft 210 containing a signal conduit 215A for RF power, a signal conduit 215B for control of the heating element 170, as well as a thermocouple 220 for monitoring the temperature of the heater body 200. The thermocouple 220 measures the temperature of the heating element 170 and/or the temperature of the heater body 200. In one embodiment, the thermocouple 220 includes a tip section 218 that is at least partially embedded in the heater body 200. The tip section 218 comprises a material or a coating having high thermal conductivity to reduce the response time of the temperature signal. In one embodiment, the tip section 218 comprises a material having a thermal conductivity of about 385 watts per meter Kelvin (W/mK), or greater, such as a thermal conductivity of about 406 W/mK to about 1,000 W/mK. Examples of materials for the tip section 218 include copper (Cu), silver (Ag), diamond, alloys and derivatives thereof. A tip section 218 having a high thermal conductive material or coating may reduce the response time of the thermocouple 220 by greater than about 10%, which in turn provides improved process control by allowing faster and more precise power application to control the temperature of the heating element 170.

The heater body 200 may be made of materials compatible with use at temperatures of at least about 400 degrees C. and greater, in the presence of a corrosive, plasma environment. For example, in some embodiments, the heater body 200 comprises a ceramic material, such as aluminum nitride (AlN). In other embodiments, the heater body 200 may be made of stainless steel, nickel, alloys thereof and combinations thereof. The shaft 210 may be a tubular member made of a ceramic material, such as AlN. One or more dielectric plugs 225A-225E may be disposed within the interior of the shaft 210 to electrically isolate the signal conduits 215A and 215B, as well as thermally insulate the thermocouple 220. In one embodiment, the shaft 210 is coupled to the heater body 200 by a diffusion bond 230, such as a diffusion welding method, or other suitable bonding method.

As shown in FIG. 2, the heater body 200 includes a top or first surface 235 which defines a substrate receiving surface, a bottom or second surface 240 opposing the first surface 235, and a sidewall or side surface 245. In some embodiments, the first surface 235 includes an alignment member 250 protruding from the first surface 235 to form a substrate receiving pocket therein that facilitates centering of a substrate (not shown). In other embodiments, the first surface 235 may include beveled, notched or stepped surfaces machined near the side surface 245 to facilitate attachment and indexing of a deposition ring (shown in FIG. 1 at 175) to the heater body 200.

In this embodiment, the thermal barrier 180 is coupled to the heater body 200 as a coating, film, foil or sheet material. The thermal barrier 180 is adhered or fixed to the heater body 200 in a manner that does not facilitate ready removal. In one embodiment, the thermal barrier 180 is adhered to at least the second surface 240 of the heater body 200 and circumscribes the shaft 210. In another embodiment, the thermal barrier 180 extends at least partially along the side surface 245 to a position that does not interfere with the deposition ring 175 coupling with the first surface 235 and/or the side surface 245.

The thermal barrier 180 may be coupled to the heater body 200 in numerous ways. The thermal barrier 180 may be deposited onto the heater body 200 by numerous deposition techniques, such as electron beam/physical vapor deposition (EB/PVD), plasma spray coating, laser sintering, and combinations thereof. The thermal barrier 180 may comprise one or more layers or films having a varied and/or a graded composition. The thermal barrier 180 may consist of multiple layers formed from different materials and/or having different physical properties. The thermal barrier 180 may be in the form of a sheet that is coupled to the heater body by fasteners or a bonding method. In one embodiment, the thermal barrier 180 consists of one or more layers of a ceramic material or other refractory materials. Examples of materials for the thermal barrier 180 include zirconium (Zr), yttrium (Y), oxides thereof and combinations thereof, aluminum nitride (AlN), as well as metallic materials such as magnesium (Mg) and/or metallic alloys such as xCrAlY (where x is cobalt, nickel, or a combination of cobalt and nickel). Examples of materials for the thermal barrier 180 also include yttrium stabilized zirconium oxide ($YZO_2$ or YSZ) and magnesium zirconium oxide ($MgZrO_2$). A metallic bond coating of xCrAlY may be used in combination with the YSZ material or the $MgZrO_2$ material. The thermal barrier 180 may comprise a low emissivity (about 0.7 to about 0.9, such as about 0.88) and/or a hardness greater than about 30 on the Rockwell C scale. Examples of materials for the thermal barrier 180 also include oxide mineral species such as Perovskite. The thermal barrier 180 may be in the form of a coating, film, foil or sheet. The thermal barrier 180 may include nano-materials as well as nano-sized elemental materials and compounds. Nano-materials as used herein includes materials (e.g., particles) having a major diameter (or other cross-sectional measurement) of about 10 nanometers. The thermal conductivity of the thermal barrier 180 may be about 0.6 W/mK to about 3 W/mK, for example about 2 W/mK to about 2.4 W/mK, in one embodiment.

Figure 3:
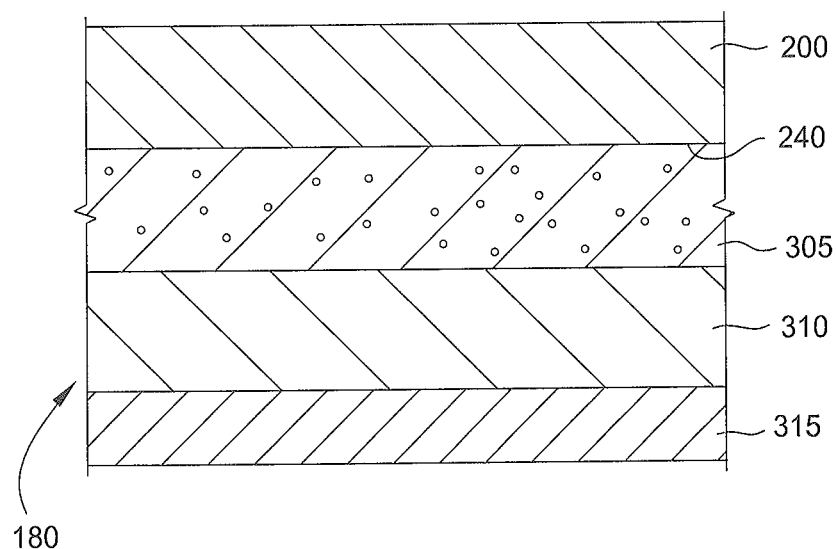
FIG. 3 is an enlarged partial cross-sectional view of the heater body and the thermal barrier of FIG. 2.

FIG. 3 is an enlarged partial cross-sectional view of the heater body 200 and the thermal barrier 180 of FIG. 2. The thermal barrier 180 comprises one or more layers 305-315. The nominal thickness of the thermal barrier 180 may be about 200 microns to about 300 microns, or greater, +/− about 50 microns. One or more of the layers 305-315 may include different materials or properties, such as thermal conductivity, density, emissivity and/or porosity. The one or more layers 305-315 may be porous. In one embodiment, the one or more layers 305-315 include a porosity of less than about 10%, such as about 0.5% to about 10%, for example, about 8% to about 10% utilizing an optical method. In another embodiment, the one or more layers 305-315 include a porosity of less than 15%, such as about 0.5% to about 15%, for example, between about 10% to about 15%, utilizing the Archimedes method. The one or more layers 305-315 may also have different thicknesses. In one embodiment, two layers 305 and 310 are used for the thermal barrier 180. A base layer 310 in this example may include a thickness that is about two-thirds of a thickness of an intermediate layer 305. The intermediate layer 305 may also be more porous than the base layer 310. Additionally, the density of one of the base layer 310 and the intermediate layer 305 may be about 5 grams/$cm^3$ to about 7 grams/$cm^3$.

FIG. 4A is a side cross-sectional view of another embodiment of a substrate support heater 110. The thermal barrier 180 is shown on the second surface 240 of the substrate support heater 110 and at least partially disposed on the side surface 245 of the substrate support heater 110. In one embodiment, the thermal barrier 180 may include a taper 400 at a terminating end 415 thereof on the side surface 245 of the substrate support heater 110. The taper 400 may include a thickness that gradually goes to zero at the terminating end 415. The taper 400 may be used to prevent deposition from attaching to the side surface 245 of the heater body 200.

FIG. 4B is an enlarged cross-sectional view of a portion of the substrate support heater 110 of FIG. 4A. The thermal barrier 180 may be disposed at points of contact between the heater body 200 and the shaft 210. The thermal barrier 180 may be configured as spacers between points of contact of the heater body 200 and the shaft 210. The thermal barrier 180 in this embodiment may be used to prevent or minimize heat transfer at points of contact between the heater body 200 and the shaft 210. An interface or joint 402 circumscribes the shaft 210 where the heater body 200 may be joined with the shaft 210. The joint 402 may comprise a weld or other applied material from a suitable joining method, such as brazing. The thermal barrier 180 between the shaft 210 and the heater body 200 near the joint 402 should be positioned to not interfere with the joint 402.

FIG. 4C is an enlarged cross-sectional view of a portion of the substrate support heater 110 of FIG. 4A. The heating element 170 is shown in the heater body 200 having one or more portions of the thermal barrier 180 disposed thereon. One portion of the thermal barrier 180 may be arcuate and at least partially surround the heating element 170 while another portion may be linear and disposed between a cap plate 405 and the heating element 170. One or both of the portions of the thermal barrier 180 may be used. In one embodiment, the thermal barrier 180 is provided about the heating element 170 so heat transfer between the heating element 170 and the heater body 200 is not significantly impacted. In one aspect, the thermal barrier 180 surrounding a portion of the heating element 170 as shown in FIG. 4C facilitates enhanced efficiency of the heating element 170 by preventing radiation of thermal energy to areas or the heater body 200 that is not in contact with the heating element 170.

FIG. 5 is a simplified cross-sectional view of another embodiment of a substrate support heater 500 that may be used in the deposition system 100 of FIG. 1. The substrate support heater 500 in this embodiment includes two piece body, comprising a heater body portion 505 and a base body portion 510. The base body portion 510 is coupled to the shaft 210. The heater body portion 505 surrounds the base body portion 510 in this embodiment and are joined at a joint 515 disposed on a lower surface of the substrate support heater 500. A thermal barrier 180 is shown between an upper surface of the base body portion 510 and the heating element 170 disposed in the heater body portion 505. The thermal barrier 180 may be one or both of a planar, linear, layer or layers, and an arcuate layer or layers that at least partially surrounds the heating element 170.

FIG. 6 is a simplified cross-sectional view of another embodiment of a substrate support heater 600 that may be used in the deposition system 100 of FIG. 1. The substrate support heater 600 in this embodiment includes two piece body, comprising a heater body portion 605 and a base body portion 610. The base body portion 610 is coupled to the shaft 210. The heater body portion 605 overlies the base body portion 610 in this embodiment and are joined at a joint 615 disposed on a side surface of the substrate support heater 600. A thermal barrier 180 is shown between an upper surface of the base body portion 610 and the heating element 170 disposed in the heater body portion 605. The thermal barrier 180 may be one or both of a planar, linear, layer or layers, and an arcuate layer or layers that at least partially surrounds the heating element 170 similar to the embodiment described in FIG. 4C.

The thermal barrier 180 as described herein improves thermal uniformity of at least one major surface of a substrate support heater, which improves the thermal uniformity of a substrate during a deposition process. The thermal barrier 180 as described herein has been implemented and exhaustively tested on a substrate support heater, such as the substrate support heater 110. Testing results indicated a temperature difference across the substrate receiving surface (i.e., first surface 235) to be minimized by a factor of about 2, or greater, at the same dwell temperature (about 400 degrees C.). For example, a conventional heater may have a delta in temperature at the substrate receiving surface of about +/−14-16 degrees C. with an average power consumption of 2,501 Watts to maintain a 400 degrees C. dwell temperature. However, a substrate support heater 110 as described herein using embodiments of the thermal barrier 180 greatly reduced the temperature delta. In one example, the temperature delta of the substrate support heater 110 was about +/−6 degrees C. with an average power consumption of 3,497 Watts to maintain a 400 degrees C. dwell temperature. The positive results were also verified with substrates on the substrate support heater 110 and temperature uniformity was also shown to be improved on the substrates.

While the foregoing is directed to embodiments of the invention, other and further embodiments of the invention may be devised without departing from the basic scope thereof.

What is claimed is:

1. A substrate support heater for supporting a semiconductor substrate, comprising:
   a heater body having a first surface configured to receive a substrate and a second surface opposing the first surface;
   a heating element disposed in the heater body between the first surface and the second surface; and
   a thermal barrier comprising yttrium material, deposited completely on the second surface of the heater body, wherein the thermal barrier comprises a first layer coupled to the second surface and a second layer deposited to on the first layer, the first layer and the second layer comprising the same yttrium material having a different density and a different thickness, and the thermal barrier has an emissivity of about 0.7 to about 0.9.

2. The substrate support heater of claim 1, wherein the heater body includes a side surface and the thermal barrier is deposited on a portion of the side surface.

3. The substrate support heater of claim 2, wherein the thermal barrier on the side surface includes a terminating end that tapers to a thickness of about zero.

4. The substrate support heater of claim 1, further comprising:
   a shaft coupled to the second surface of the heater body.

5. The substrate support heater of claim 4, wherein the thermal barrier is disposed between the shaft and the heater body.

6. The substrate support heater of claim 1, wherein a porosity of the first layer is different than a porosity of the second layer.

7. The substrate support heater of claim 1, wherein an emissivity of the first layer is different than an emissivity of the second layer.

8. The substrate support heater of claim 1, wherein the second layer includes a thickness that is less than a thickness of the first layer.

9. The substrate support heater of claim 1, wherein the second layer includes a thickness that is about two-thirds less than a thickness of the first layer.

10. A deposition chamber for processing a semiconductor substrate, comprising:

an interior volume; and
a substrate support heater disposed in the interior volume, the substrate support heater comprising:
a heater body having a first surface to receive a substrate and a second surface opposing the first surface;
a heating element disposed in the heater body between the first surface and the second surface;
a shaft coupled to the second surface of the heater body; and
a first thermal barrier comprising yttrium material and deposited completely on the second surface of the heater body, and a second thermal barrier adhered to a portion of the heating element, wherein;
the first thermal barrier comprises a coating consisting of the yttrium material and includes at least a first layer and a second layer deposited on the first layer, the first layer and the second layer having a different density, and wherein an emissivity of the first layer is different than an emissivity of the second layer.

11. The chamber of claim 10, wherein the second thermal barrier is disposed between the shaft and the heater body.

12. The chamber of claim 11, wherein the second thermal barrier comprises a coating, sheet or a foil.

13. The chamber of claim 10, wherein the second thermal barrier is arcuate and surrounds a portion of the heating element.

14. The chamber of claim 10, wherein the first thermal barrier is disposed between the shaft and the second surface of the heater body.

15. The chamber of claim 10, further comprising a lift plate at least partially disposed in the interior volume, the lift plate including a reflective surface facing the heater body.

16. The chamber of claim 10, wherein the heater body includes a side surface and the first thermal barrier is deposited on a portion of the side surface.

17. The chamber of claim 16, wherein the first thermal barrier on the side surface includes a terminating end that tapers to a thickness of about zero.

18. The chamber of claim 10, wherein a porosity of the first layer is different than a porosity of the second layer.

* * * * *